United States Patent [19]
Crowley

[11] Patent Number: 6,046,621
[45] Date of Patent: Apr. 4, 2000

[54] DIFFERENTIAL SIGNAL GENERATOR WITH DYNAMIC BETA RATIOS

[75] Inventor: Matthew P. Crowley, San Jose, Calif.

[73] Assignee: Advanced Micro Devices, Inc., Sunnyvale, Calif.

[21] Appl. No.: 08/938,193

[22] Filed: Sep. 26, 1997

Related U.S. Application Data

[60] Provisional application No. 60/027,329, Sep. 30, 1996.

[51] Int. Cl.[7] ...................................................... H03L 5/00
[52] U.S. Cl. ......................... 327/333; 327/112; 327/437; 326/87
[58] Field of Search ........................... 327/108–112, 257, 327/258, 434, 436, 437; 326/85, 87

[56] References Cited

U.S. PATENT DOCUMENTS

| | | | |
|---|---|---|---|
| 4,833,349 | 5/1989 | Liu et al. .................................. | 326/87 |
| 5,122,690 | 6/1992 | Bianchi ..................................... | 326/87 |
| 5,166,555 | 11/1992 | Kano ........................................ | 326/87 |
| 5,338,987 | 8/1994 | Tomasetti et al. ....................... | 327/108 |
| 5,369,318 | 11/1994 | Kuroda et al. ........................... | 326/66 |
| 5,438,277 | 8/1995 | Sharpe-Geisler ......................... | 326/87 |
| 5,491,432 | 2/1996 | Wong et al. .............................. | 326/86 |
| 5,517,148 | 5/1996 | Yin ........................................... | 327/333 |
| 5,528,173 | 6/1996 | Merritt et al. ............................ | 326/80 |

*Primary Examiner*—Kenneth B. Wells
*Attorney, Agent, or Firm*—Skjerven, Morrill, MacPherson, Franklin & Friel, LLP

[57] ABSTRACT

A differential signal generator for generating a true/complement output signal pair in response to a single-ended input signal is disclosed. The differential signal generator includes an input stage that generates a true/complement intermediate signal pair in response to the input signal, and first and second inverters that generate the output signal pair in response to the intermediate signal pair. The first and second inverters have dynamic beta ratios that change in response to the input signal. This is accomplished by coupling a transistor in the first inverter to ground and decoupling a transistor in the second inverter from ground when the input signal has a high value, and decoupling the transistor in the first inverter from ground and coupling the transistor in the second inverter to ground when the input signal has a low value. As a result, the output signal pair cross each other at a predetermined cross-point although the intermediate signal pair does not.

32 Claims, 5 Drawing Sheets

DIFFERENTIAL SIGNAL GENERATOR WITH DYNAMIC BETA RATIOS

CROSS-REFERENCE TO RELATED APPLICATIONS

This application claims the benefit of U.S. Provisional Application No. 60/027,329, filed Sep. 30, 1996.

BACKGROUND OF THE INVENTION

1. Field of the Invention

The present invention relates to electronic circuits, and more particularly to differential signal generators.

2. Description of Related Art

Differential signal generators are used to generate a true/complement output signal pair in response to a single-ended input signal. A differential signal generator receives a single-ended input signal that transitions between a high value (logical "1") and a low value (logical "0"), and generates an output signal pair that includes a first signal and a second signal. For instance, the first signal can be the true signal with the same logical value as the input signal, and the second signal can be the complement signal with an opposite logical value to the input signal. Alternatively, the first signal can be the complement signal and the second signal can be the true signal.

Differential signal generators are used in a variety of applications. For instance, a differential signal generator can be used to drive the switches of a charge pump in a phase-locked loop. In this application, it may be necessary for the output signal pair to be level shifted with respect to the input signal, such that the output signal pair has a greater voltage swing than the input signal. Furthermore, it may be critical for the output signal pair to cross each other at about the 50% cross-point (between their high and low logical values) in response to transitions of the input signal in order to assure proper operation of the charge pump.

Figure 1:
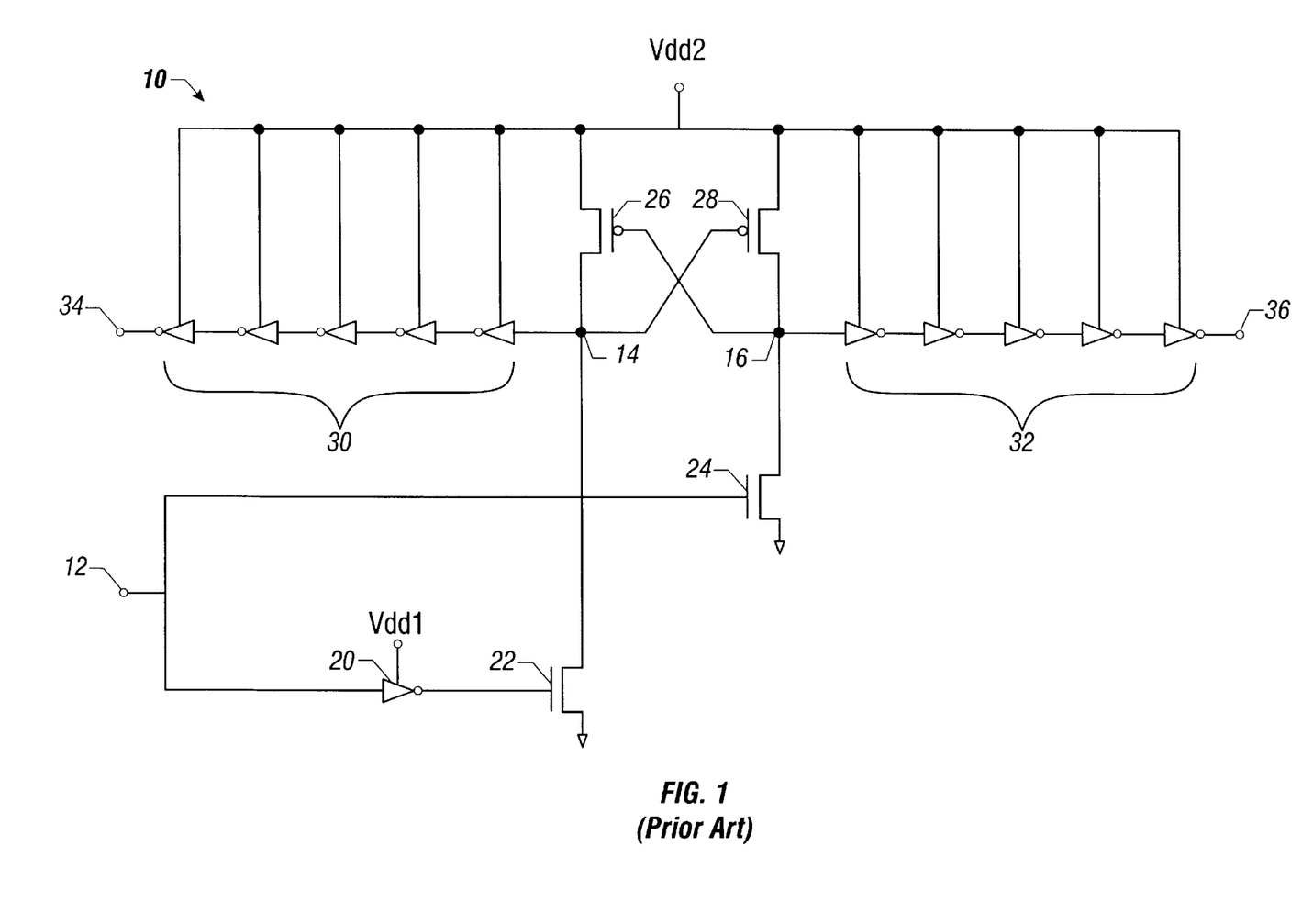
FIG. 1 is a schematic diagram of a conventional differential signal generator which provides a level-shifted output signal pair which cross each other at about the 50% cross-point.
Figure 2:
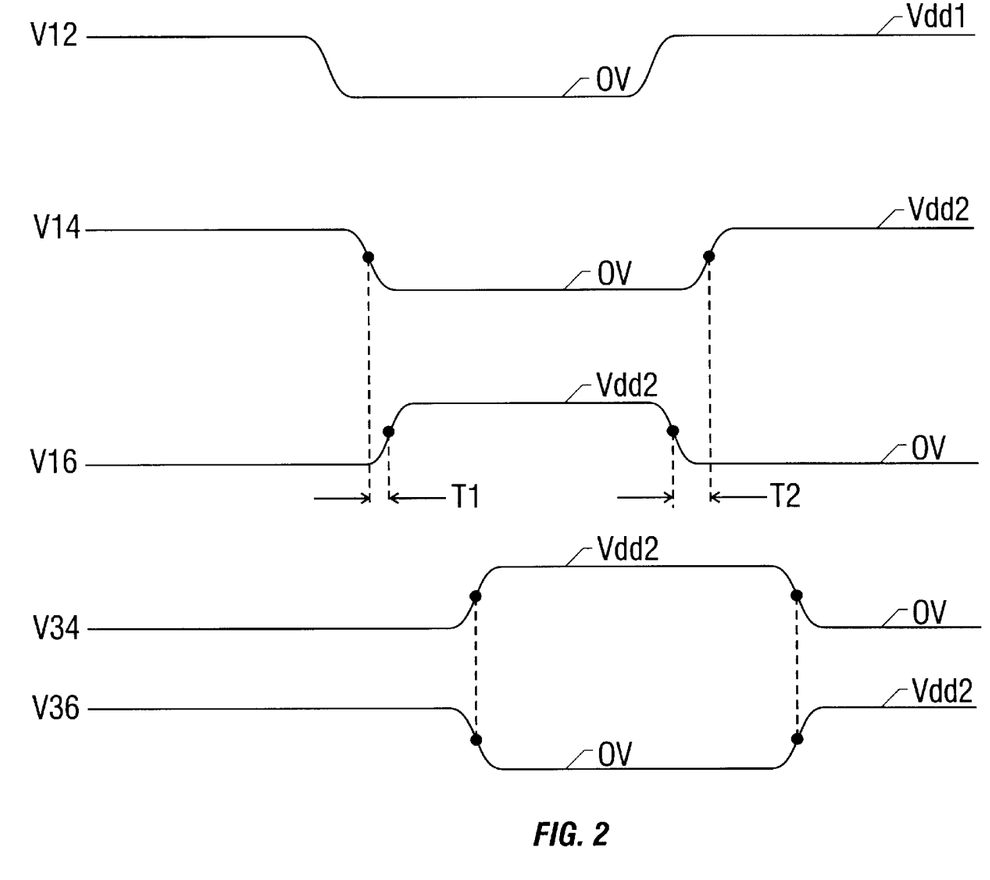
FIG. 2 is a timing diagram of signals associated with the differential signal generator of FIG. 1.

FIG. 1 is a schematic diagram of a conventional differential signal generator 10 which provides a level-shifted output signal pair which cross each other at about the 50% cross-point, and FIG. 2 is a timing diagram of signals associated with differential signal generator 10. Differential signal generator 10 receives single-ended input signal V12 at input terminal 12, and generates a true/complement intermediate signal pair consisting of signal V14 (the true signal) at node 14 and signal V16 (the complement signal) at node 16. Input signal V12 is a digital signal that transitions between a high value (or logical "1" at supply voltage Vdd1) and a low value (or logical "0" at ground), and intermediate signal pair V14 and V16 are digital signals that transition between a high value (or logical "1" at supply voltage Vdd2) and a low value (or logical "0" at ground). Supply voltage Vdd2 is greater than supply voltage Vdd1. For example, supply voltage Vdd1 is in the range of 1.2 to 2.5 volts, and supply voltage Vdd2 is in the range of 3.0 to 3.6 volts. As a result, intermediate signal pair V14 and V16 is level shifted with respect to input signal V12. For illustration purposes, the signals have rise and fall times of about 100 picoseconds.

Differential signal generator 10 includes inverting stage 20, N-channel transistors 22 and 24, and P-channel transistors 26 and 28. Transistors 22 and 24 are about twice the size of and have larger drive currents than transistors 26 and 28. Therefore, when transistors 22 and 26 are turned on, node 14 is pulled essentially to ground, and when transistors 24 and 28 are turned on, node 16 is pulled essentially to ground.

When input signal V12 is high, transistor 24 turns on and transistor 22 turns off. This pulls node 16 essentially to ground, thereby turning on transistor 26, which in turn pulls node 14 to voltage Vdd2 and turns off transistor 28. Accordingly, signal V14 goes high and signal V16 goes low in response to input signal V12 going high. Conversely, when input signal V12 is low, transistor 24 turns off and transistor 22 turns on. This pulls node 14 essentially to ground, thereby turning on transistor 28, which in turn pulls node 16 to voltage Vdd2 and turns off transistor 26. Accordingly, signal V14 goes low and signal V16 goes high in response to input signal V12 going low. Advantageously, cross-coupling transistors 26 and 28 avoids a crowbar current path from Vdd2 to ground.

Unfortunately, however, as seen in FIG. 2, when transitions occur, intermediate signal pair V14 and V16 do not cross each other at or near the 50% cross-point. For instance, when input signal V12 transitions low, transistor 24 turns off without having an appreciable effect on node 16 since node 16 is at ground and transistor 28 is off. After input signal V12 propagates through inverting stage 20, transistor 22 turns on and pulls node 14 towards ground. Thereafter, transistor 28 turns on and pulls node 16 towards voltage Vdd2, and transistor 26 turns off. Thus, the falling edge of signal V14 leads the rising edge of signal V16 by time T1 (about 80 to 120 picoseconds) associated with the turn-on time of transistor 28, and signals V14 and V16 cross each other near ground. Similarly, when input signal V12 transitions high, transistor 24 turns on and pulls node 16 towards ground. Thereafter, transistor 26 turns on, and input signal V12 propagates through inverting stage 20 so that transistor 22 turns off, node 14 is pulled towards voltage Vdd2, and transistor 28 turns off. Thus, the falling edge of signal V16 leads the rising edge of signal V14 by time T2 (about 80 to 120 picoseconds) associated with the propagation delay of inverting stage 20, and signals V14 and V16 cross each other near ground. Consequently, intermediate signal pair V14 and V16 is a "make or break" signal pair without a 50% cross-point.

Differential signal generator 10 addresses this problem by coupling inverter chains 30 and 32 to nodes 14 and 16, respectively, to generate true/complement output signal pair V34 and V36 at output terminals 34 and 36, respectively. Inverter chains 30 and 32 are each composed of successive inverting stages. As seen in FIG. 2, inverter chains 30 and 32 introduce suitable delays so that output signal pair V34 and V36 cross each other at about the 50% cross-point. This can be accomplished, for instance, by designing appropriate beta ratios and/or loading for the inverting stages.

A major drawback of differential signal generator 10 is that inverter chains 30 and 32 occupy a considerable amount of surface area. It is, of course, highly desirable to reduce the size of a given circuit whenever possible. Another drawback of differential signal generator 10 is that the delays introduced by inverter strings 30 and 32 are highly sensitive to process variations (effective channel lengths, gate oxide thicknesses, etc.).

Accordingly, a need exists for a differential signal generator that provides a true/complement output signal pair that cross each other at a predetermined cross-point, such as the 50% cross-point, in response to a single-ended input signal, particularly where the signal generator reduces space requirements and provides level shifting.

SUMMARY OF THE INVENTION

The present invention provides a differential signal generator which fulfills the need in the art described above.

In accordance with one aspect of the invention, a differential signal generator includes an input stage that generates a true/complement intermediate signal pair in response to the input signal, and first and second inverters that generate the output signal pair in response to the intermediate signal pair. The first and second inverters have dynamic beta ratios that change in response to the input signal. This is accomplished by selectively coupling and decoupling transistors in the first and second inverters to a power supply terminal in response to the input signal so that the first and second inverters have beta ratios that are state dependent.

For example, the preferred embodiment includes coupling a transistor in the first inverter to ground and decoupling a transistor in the second inverter from ground when the input signal has a high value, and decoupling the transistor in the first inverter from ground and coupling the transistor in the second inverter to ground when the input signal has a low value. It is also preferred that the first inverter includes a P-channel transistor and two N-channel transistors, the second inverter includes a P-channel transistor and two N-channel transistors, and the input signal selectively couples and decouples one of the N-channel transistors in the first inverter and one of the N-channel transistors in the second inverter to and from ground. In this manner, the first and second inverters have dynamic beta ratios (or trip points) that offset timing differences between the intermediate signal pair. As a result, the output signal pair cross each other at a predetermined cross-point although the intermediate signal pair does not.

Advantageously, the differential signal generator of the present invention requires fewer transistors, and thus occupies less space, than conventional circuits with similar functionality. Another advantage is that the differential signal generator can provide the output signal pair with a 50% cross-point and level shifting with respect to the input signal. Thus, the differential signal generator is particularly well-suited for driving the switches of a charge pump in a phase-locked loop.

These and other objects, features and advantages of the invention will be further described and more readily apparent from a review of the detailed description of the preferred embodiments which follows.

DETAILED DESCRIPTION OF THE PREFERRED EMBODIMENTS

Figure 3:
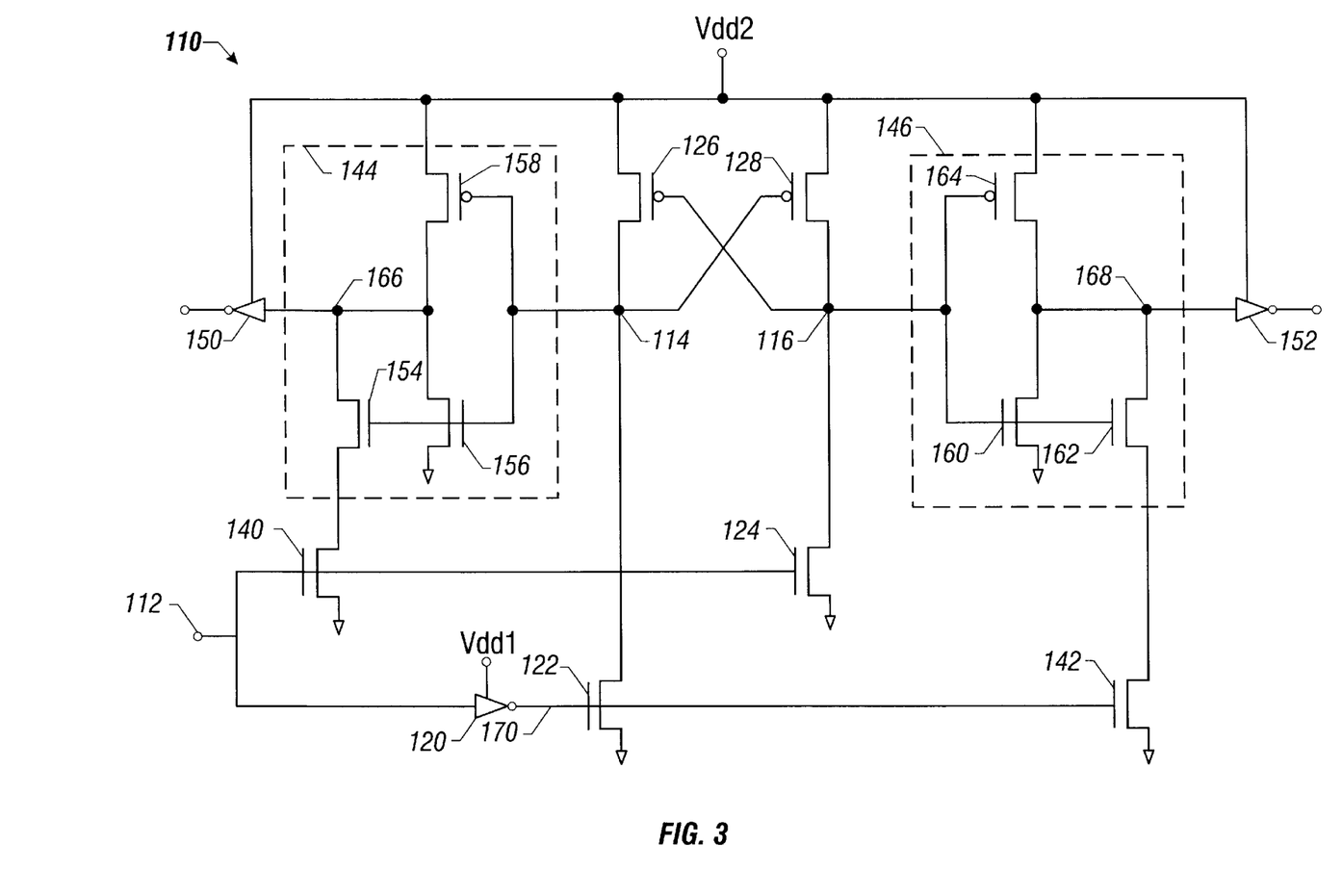
FIG. 3 is a schematic diagram of a differential signal generator in accordance with the present invention which provides a level-shifted output signal pair which cross each other at about the 50% cross-point.
Figure 4:
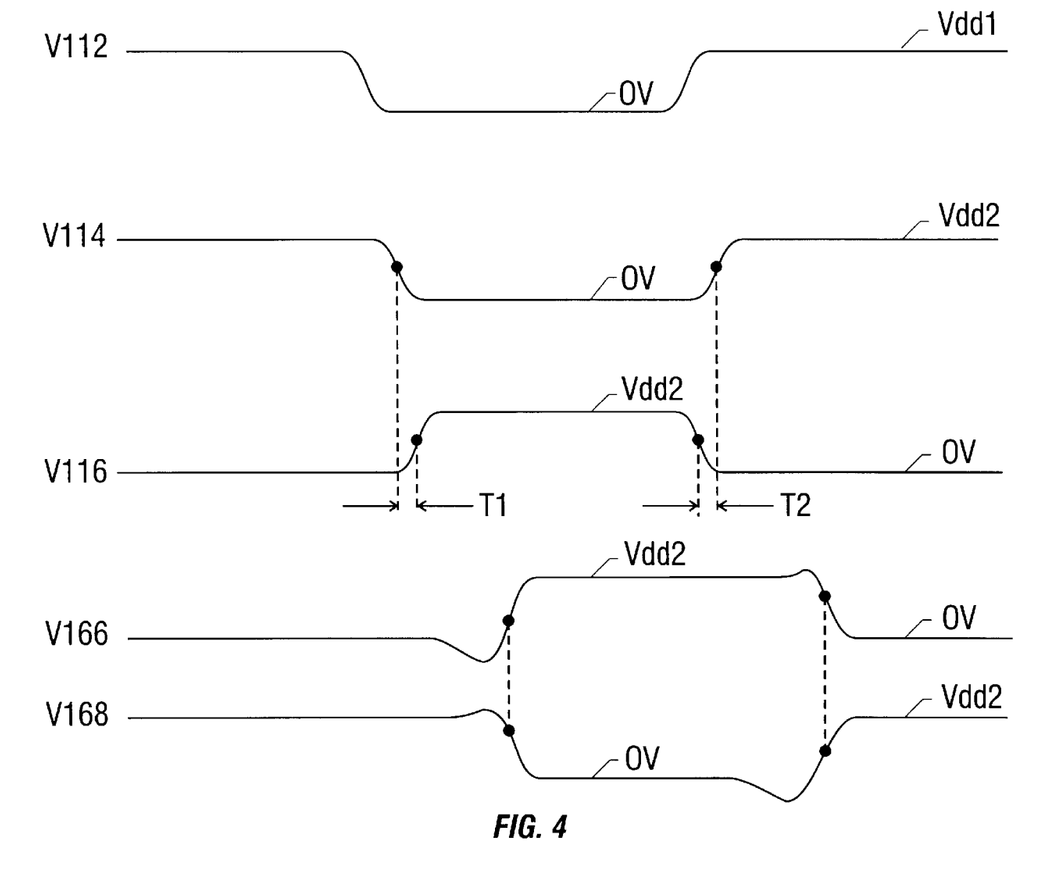
FIG. 4 is a timing diagram of signals associated with the differential signal generator of FIG. 3.

FIG. 3 is a schematic diagram of a differential signal generator 110 in accordance with the present invention which provides a level-shifted output signal pair which cross each other at about the 50% cross-point, and FIG. 4 is a timing diagram of signals associated differential signal generator 110.

Differential signal generator 110 includes input terminal 112, nodes 114 and 116, inverting stage 120, N-channel transistors 122 and 124, and P-channel transistors 126 and 128, which are essentially identical to input terminal 12, nodes 14 and 16, inverting stage 20, N-channel transistors 22 and 24, and P-channel transistors 26 and 28, respectively, of differential signal generator 10. Differential signal generator 110 does not include inverter chains 30 and 32. Instead, differential signal generator 110 replaces inverter chains 30 and 32 with N-channel transistors 140 and 142, compound inverters 144 and 146 (within the broken lines), and output buffering inverters 150 and 152. As is seen, compound inverter 144 includes N-channel transistors 154 and 156 and P-channel transistor 158, and compound inverter 146 includes N-channel transistors 160 and 162 and P-channel transistor 164. Inverting stage 120 and output buffering inverters 150 and 152 are each basic CMOS inverters consisting of an N-channel transistor and a P-channel transistor, as is conventional. Since the inverting stages in inverter chains 30 and 32 are also basic CMOS inverters, differential signal generator 110 requires eight fewer transistors than differential signal generator 10. Moreover, differential signal generator 110 generates output signal pair V166 and V168 at nodes 166 and 168, respectively, that not only are level shifted with respect to input signal V112 (applied to input terminal 112), but also cross each other at about the 50% cross-point. Thus, differential signal generator 110 occupies less surface area than differential signal generator 10 while providing similar functionality.

Of importance, compound inverters 144 and 146 have dynamic beta ratios. That is, compound inverters 144 and 146 have beta ratios that are state dependent with respect to input signal V112. Generally speaking, the beta ratio ($\beta$) of a basic CMOS inverter is defined as the beta ratio ($\beta_P$) of the P-channel transistor divided by the beta ratio ($\beta_N$) of the N-channel transistor, or $$\beta=(\beta_P)/(\beta_N) \tag{1}$$

$$\beta=(W_P/L_P)/(W_N/L_N) \tag{2}$$

where $W_P$ is the channel width of the P-channel transistor, $L_P$ is the channel length of the P-channel transistor, $W_N$ is the channel width of the N-channel transistor, and $L_N$ is the channel length of the N-channel transistor.

The trip point (or threshold voltage) of a basic CMOS inverter is generally defined as the input voltage at which the inverter changes output states. That is, if the input voltage is above the trip point then the inverter generates a logical "0", and if the input voltage is below the trip point then the inverter generates a logical "1". If the inverter is coupled to power supply terminals at voltage Vdd and ground, the trip point (TP) can be approximated as $$TP=\beta(\mu_P/\mu_N)(Vdd/2) \tag{3}$$

where $\mu_P$ is the mobility of holes, and $\mu_N$ is the mobility of electrons. The mobility of electrons can be approximated as being 2.5 times that of the mobility of holes. Furthermore, the N-channel transistor and the P-channel transistor typically have identical channel lengths that either correspond to the minimum length of the manufacturing process, or are slightly larger than this minimum length in order to reduce high-field effects such as hot carrier effects and drain-to-bulk current flow. Therefore, the trip point can be approximated as $$TP=(W_P/W_N)(Vdd/5) \tag{4}$$

For example, in accordance with expression (4), a trip point of Vdd/2 can be approached by providing the P-channel transistor with a channel width that is 2.5 times that of the N-channel transistor. Expression (4) also indicates that the trip point can be increased by increasing the channel width of the P-channel transistor with respect to the N-channel transistor, and the trip point can be decreased by increasing the channel width of the N-channel transistor with respect to the P-channel transistor.

Expressions (1) through (4) also apply to compound CMOS inverters with more than two transistors. For example, a compound CMOS inverter can have one P-channel transistor and two parallel-connected N-channel transistors. In this instance, the term WN represents the combined channel widths of the two N-channel transistors. Furthermore, if an additional N-channel transistor is coupled between one of the two parallel-connected transistors and ground, and the additional N-channel transistor has significantly larger drive current than the parallel-connected transistor to which it is coupled, then when the additional N-channel transistor is turned on (in the saturation region) it provides a virtual ground with no appreciable effect on expressions (1) through (4).

Referring again to FIGS. 3 and 4, compound inverter 144 includes parallel-connected N-channel transistors 154 and 156, and compound inverter 146 includes parallel-connected N-channel transistors 160 and 162. Transistors 140 and 142 and the transistors in inverting stage 120 have smaller drain-to source voltages, and thus are less susceptible to high-field effects, than the other transistors in differential signal generator 110. Accordingly, transistors 140 and 142 and the transistors in inverting stage 120 have channel lengths corresponding to the minimum length of the manufacturing process, which are about 60% of the channel lengths of the other transistors in differential signal generator 110. Furthermore, transistors 140, 142, 154 and 162 have the same channel widths. Therefore, transistors 140 and 142 have substantially larger drive currents than transistors 154 and 162.

When input signal V112 is high, transistor 140 turns on and couples transistor 154 to ground, and transistor 142 turns off and decouples transistor 162 from ground. In this state, transistor 140 provides a virtual ground for transistor 154, transistors 154 and 156 collectively provide the N-channel transistor for compound inverter 144, and transistor 160 alone provides the N-channel transistor for compound inverter 146. That is, the combined channel widths of transistors 154 and 156 provide $W_N$ for compound inverter 144, transistor 140 has no appreciable effect on $W_N$ for compound inverter 144, and the channel width of transistor 160 alone provides $W_N$ for compound inverter 146 (which effectively becomes a basic inverter). Likewise, when input signal V112 is low, transistor 140 turns off and decouples transistor 154 from ground, and transistor 142 turns on and couples transistor 162 to ground. In this state, transistor 156 alone provides the N-channel transistor for compound inverter 144, transistor 142 provides a virtual ground for transistor 162, and transistors 160 and 162 collectively provide the N-channel transistor for compound inverter 146. That is, the channel width of transistor 156 alone provides $W_N$ for compound inverter 144 (which effectively becomes a basic inverter), the combined channel widths of transistors 160 and 162 provides $W_N$ for compound inverter 146, and transistor 142 has no appreciable effect on $W_N$ for compound inverter 146.

Therefore, in accordance with expression (2), the beta ratio of compound inverter 144 decreases when input signal V112 is high and increases when input signal V112 is low, and the beta ratio of compound inverter 146 increases when input signal V112 is high and decreases when input signal V112 is low. Likewise, in accordance with expression (4), the trip point of compound inverter 144 decreases when input signal V112 is high and increases when input signal V112 is low, and the trip point of compound inverter 146 increases when input signal V112 is high and decreases when input signal V112 is low.

The gate-to-drain capacitances of transistors 156 and 158 provide Miller capacitance between nodes 114 and 166, and the gate-to-drain capacitances of transistors 160 and 164 provide Miller capacitance between nodes 116 and 168. Therefore, when signal V114 transitions low, signal V166 is pulled slightly below ground before it transitions high, and when signal V114 transitions high, signal V166 is pulled slightly above voltage Vdd2 before it transitions low. Likewise, when signal V116 transitions low, signal V168 is pulled slightly below ground before it transitions high, and when signal V116 transitions high, signal V168 is pulled slightly above voltage Vdd2 before it transitions low.

The positive excursions of signals V166 and V168 above voltage Vdd2 have smaller magnitudes and smaller durations than the negative excursions of signals V166 and V168 below ground due to the dynamic beta ratios of compound inverters 144 and 146. That is, as signal V166 transitions low, compound inverter 144 more rapidly discharges the capacitively coupled charge at node 166 due to its decreased beta ratio, and as signal V166 transitions high, compound inverter 144 less rapidly discharges the capacitively coupled charge at node 166 due to its increased beta ratio. Likewise, as signal V168 transitions low, compound inverter 146 more rapidly discharges the capacitively coupled charge at node 168 due to its decreased beta ratio, and as signal V168 transitions high, compound inverter 146 less rapidly discharges the capacitively coupled charge at node 168 due to its increased beta ratio.

In addition, the falling edges of signals V166 and V168 have steeper slopes than the rising edges of signals V166 and V168 since transistors 154 and 156 are capable of pulling node 166 towards ground more rapidly than transistor 158 is capable of pulling node 166 towards voltage Vdd2, and likewise, transistors 160 and 162 are capable of pulling node 168 towards ground more rapidly than transistor 164 is capable of pulling node 168 towards voltage Vdd2. Thus, signals V166 and V168 have longer rise times than fall times.

During operation, signals V114 and V168 transition low and signals V116 and V166 transition high in response to input signal V112 transitioning low. The falling edge of signal V114 leads the rising edge of signal V116 by time T1, and signals V114 and V116 cross each other near ground. In addition, the beta ratio and trip point of compound inverter 144 increase, and the beta ratio and trip point of compound inverter 146 decrease. Although compound inverter 144 triggers (or trips) before compound inverter 146, the falling edge of signal V168 has a smaller excursion and steeper slope than the rising edge of signal V166. This enables signal V168 to approach the 50% cross-point more rapidly than signal V166. As a result, signal V168 catches up with signal V166 with respect to the 50% cross point.

Similarly, signals V114 and V168 transition high and signals V116 and V166 transition low in response to input signal V112 transitioning high. The falling edge of signal V116 leads the rising edge of signal V114 by time T2, and signals V114 and V116 cross each other near ground. In addition, the beta ratio and trip point of compound inverter 144 decrease, and the beta ratio and trip point of compound inverter 146 increase. Although compound inverter 146 triggers (or trips) before compound inverter 144, the failing edge of signal V166 has a smaller excursion and steeper slope than the rising edge of signal V168. This enables signal V166 to approach the 50% cross-point more rapidly than signal V168. As a result, signal V166 catches up with signal V168 with respect to the 50% cross point.

Accordingly, the dynamic beta ratios of compound inverters 144 and 146 offset timing differences between intermediate signal pair V114 and V116 so that output signal pair V166 and V168 cross each other at about the 50% cross-point.

Finally, output signal pair V166 and V168 are applied to output buffering inverters 150 and 152 to assure that the switching characteristics at nodes 166 and 168 are matched. Thus, output buffering inverters 150 and 152 generate output signals that are complemented and shifted by an inverter delay with respect to signals V166 and V168, respectively.

Preferably, the left and right sides of differential signal generator 110 are mirror images that are matched to one another. That is, transistors 126 and 128 are matched, transistors 158 and 164 are matched, transistors 156 and 160 are matched, transistors 154 and 162 are matched, transistors 122 and 124 are matched, transistors 140 and 142 are matched, and inverters 150 and 152 are matched.

Figure 5:
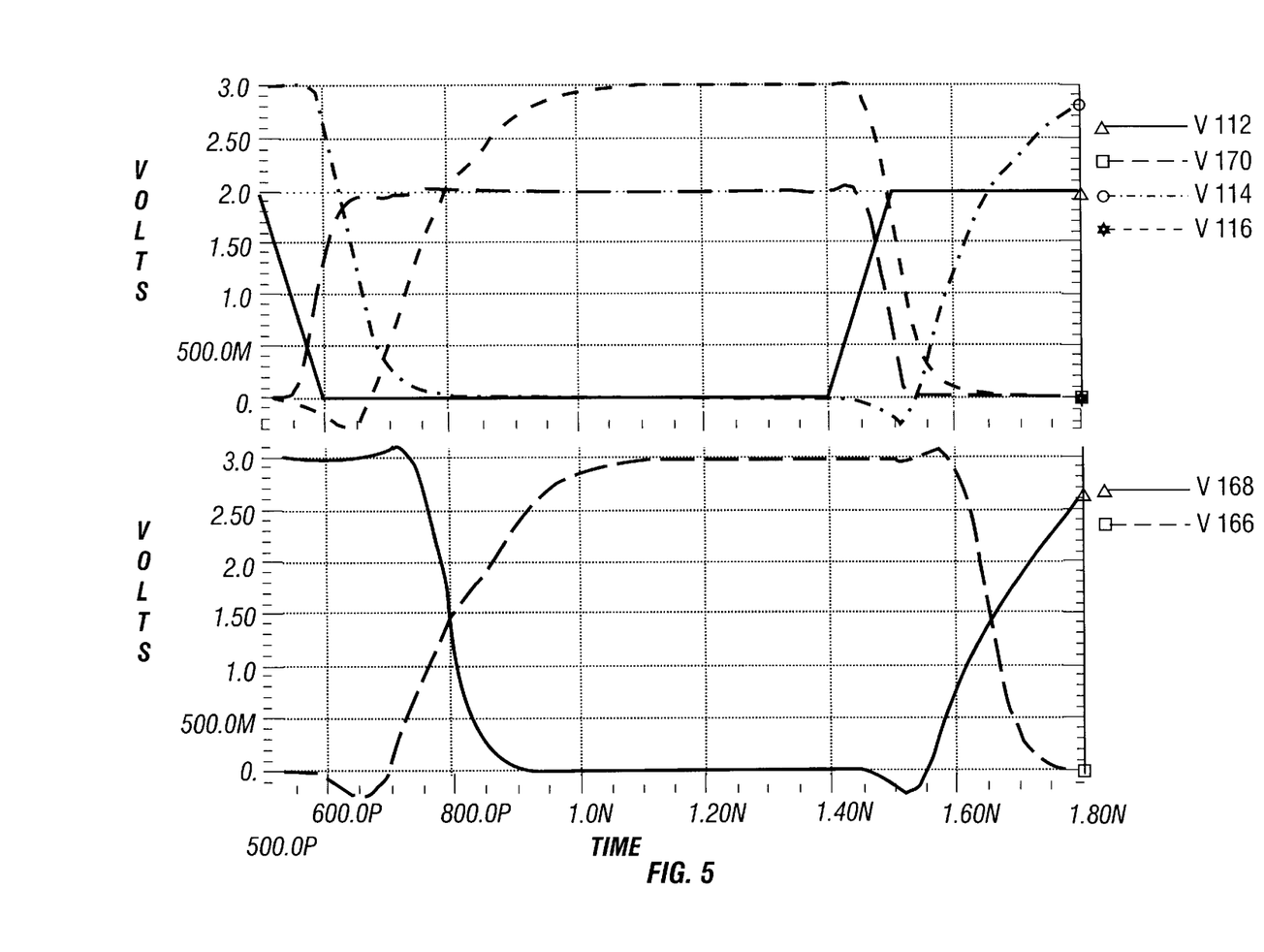
FIG. 5 is a computer simulated timing diagram of signals associated with the differential signal generator of FIG. 3.

FIG. 5 is a computer simulated timing diagram of signals associated with the differential signal generator 110. The simulation shows signals V112, V114, V116, V166 and V168, as well as signal V170 generated at output 170 of inverting stage 120. The simulation was performed with voltage Vdd1 set to 2 volts and voltage Vdd2 set to 3 volts. The simulation was initially run for 500 picoseconds (not shown) to assure proper initialization of the nodes. The results between 500 picoseconds and 1.8 nanoseconds are shown. As is seen, intermediate signal pair V114 and V116 cross each other at about 0.4 volts (the 7.5% cross-point), whereas output signal pair V166 and V168 cross each other at about 1.5 volts (the 50% cross point). The positive excursions of output signal pair V166 and V168 above 3 volts have smaller magnitudes and smaller durations than the negative excursions of output signal pair V166 and V168 beneath ground. In addition, the falling edges of output signal pair V166 and V168 are steeper than the rising edges of output signal pair V166 and V168.

Several advantages of differential signal generator 110 will be understood. First, differential signal generator 110 is smaller and more efficient than comparable circuits with similar functionality. Second, differential signal generator 110 provides a high-speed level-shifter which amplifies the input signal without distorting pulse width. Third, differential signal generator 110 is less susceptible to process variations than comparable circuits with long inverter chains. Fourth, differential signal generator 110 includes cross-coupled P-channel transistors that avoid a crowbar current path between the power supply terminal (Vdd2) and ground.

Numerous variations can be made to the embodiment described above. For instance, while level shifting the output signal pair with respect to the input signal is often desirable, the present invention can be implemented without level shifting (Vdd1=Vdd2). Although the output signal pair is illustrated as crossing each other at about the 50% cross-point, other predetermined cross-points can be obtained by selecting appropriate device ratios for the transistors. While CMOS transistors are illustrated as the switching devices, any suitable switching devices may be used.

The present invention is particularly well-suited for driving the switches of a charge pump in a phase-locked loop of a microprocessor embedded in an integrated circuit chip. In this application, the input signal is a low-going pulse provided by a phase/frequency detector, and the output signal pair (by virtue of its 50% cross-point) reduces capacitive injection in the charge pump that would otherwise disturb the loop filter voltage and create jitter in the voltage-controlled oscillator.

Other variations and modifications of the embodiments disclosed herein may be made based on the description set forth herein without departing from the scope and spirit of the invention as set forth in the following claims.

What is claimed is:

1. A differential signal generator, comprising:
   a first inverter for generating a first signal of a true/complement output signal pair in response to a single-ended input signal, wherein the first inverter has a beta ratio that changes in response to the input signal; and
   a second inverter for generating a second signal of the true/complement output signal pair in response to the input signal, wherein the second inverter has a beta ratio that changes in response to the input signal;
   wherein the beta ratio of the first inverter decreases and the beta ratio of the second inverter increases in response to the input signal having a high value; and
   wherein the beta ratio of the first inverter increases and the beta ratio of the second inverter decreases in response to the input signal having a low value.

2. The differential signal generator of claim 1, wherein:
   the beta ratio of the first inverter is a first value and the beta ratio of the second inverter is a second value in response to the input signal having a high value; and
   the beta ratio of the first inverter is the second value and the beta ratio of the second inverter is the first value in response to the input signal having a low value.

3. The differential signal generator of claim 1, wherein the output signal pair is level shifted with respect to the input signal.

4. The differential signal generator of claim 1 wherein the differential signal generator is implemented on an integrated circuit chip.

5. The differential signal generator of claim 1 wherein the first and second inverters each include a transistor channel having a width, wherein the beta ratio of each inverter is increased or decreased by varying the width of its respective transistor channel in response to the input signal.

6. The differential signal generator of claim 1 wherein the first and second inverters each include:
   a transistor channel of a first type having a width (W1) and a length (L1); and
   a transistor channel of a second type having a width (W2) and a length (L2);
   wherein the beta ratio of each inverter is defined by (W1/L1)/(W2/L2).

7. A differential signal generator, comprising:
   an input terminal for receiving a single-ended input signal;
   an inverting stage for receiving the input signal;
   a first switch coupled to the inverting stage;
   a second switch coupled to the input terminal;
   a first node coupled to the first switch;
   a second node coupled to the second switch;
   a first inverter coupled to the first node for generating a first signal of a true/complement output signal pair in response to the input signal, wherein the first inverter has a beta ratio that changes in response to the input signal; and a second inverter coupled to the second node for generating a second signal of the true/complement output signal pair in response to the input signal, wherein the second inverter has a beta ratio that changes in response to the input signal.

8. The differential signal generator of claim 7, wherein:

the beta ratio of the first inverter is a first value and the beta ratio of the second inverter is a second value in response to the input signal having a high value; and the beta ratio of the first inverter is the second value and the beta ratio of the second inverter is the first value in response to the input signal having a low value.

9. The differential signal generator of claim 7, including:

a third switch that couples a first transistor in the first inverter to a power supply terminal in response to the input signal having a high value, thereby changing the beta ratio of the first inverter in response to the input signal; and a fourth switch that couples a second transistor in the second inverter to the power supply terminal in response to the input signal having a low value, thereby changing the beta ratio of the second inverter in response to the input signal.

10. The differential signal generator of claim 9, wherein:

the first and fourth switches are transistors with control terminals coupled to an output of the inverting stage; and the second and third switches are transistors with control terminals coupled to the input terminal.

11. The differential signal generator of claim 9, wherein:

the first inverter includes a P-channel transistor and two N-channel transistors, and one of the N-channel transistors in the first inverter is the first transistor; and the second inverter includes a P-channel transistor and two N-channel transistors, and one of the N-channel transistors in the second inverter is the second transistor.

12. The differential signal generator of claim 7 wherein the first and second inverters each include a transistor channel having a width, wherein the beta ratio of each inverter is changed by varying the width of its respective transistor channel in response to the input signal.

13. The differential signal generator of claim 7 wherein the first and second inverters each include:

a transistor channel of a first type having a width (W1) and a length (L1); and a transistor channel of a second type having a width (W2) and a length (L2);

wherein the beta ratio of each inverter is defined by (W1/L1)/(W2/L2).

14. A differential signal generator, comprising:

an input terminal for receiving a single-ended input signal;

an inverting stage with an input coupled to the input terminal;

first and second transistors with control terminals coupled to the input terminal;

third and fourth transistors with control terminals coupled to an output of the inverting stage;

a first node coupled to third transistor;

a second node coupled to the second transistor;

a first inverter including fifth, sixth and seventh transistors with control terminals coupled to the first node, and with output terminals coupled to a third node, wherein the seventh transistor is coupled to the first transistor;

a second inverter including eighth, ninth and tenth transistors with control terminals coupled to the second node, and with output terminals coupled to a fourth node, wherein the tenth transistor is coupled to the fourth transistor; and eleventh and twelfth transistors each coupled to the first and second nodes.

15. The differential signal generator of claim 14, wherein:

the first, second, third, fourth, sixth, and ninth transistors have output terminals coupled to a first power supply terminal; and the fifth, eighth, eleventh and twelfth transistors have output terminals coupled to a second power supply terminal.

16. The differential signal generator of claim 14, wherein the first, second, third, fourth, sixth, seventh, ninth and tenth transistors are complementary to the fifth, eighth, eleventh and twelfth transistors.

17. The differential signal generator of claim 14, wherein:

the first transistor has output terminals coupled to the seventh transistor and a first power supply terminal;

the second transistor has output terminals coupled to the second node and the first power supply terminal;

the third transistor has output terminals coupled to the first node and the first power supply terminal;

the fourth transistor has output terminals coupled to the tenth transistor and the first power supply terminal;

the fifth transistor has output terminals coupled to the third node and a second power supply terminal;

the sixth transistor has output terminals coupled to the third node and the first power supply terminal;

the seventh transistor has output terminals coupled to the first transistor and the third node;

the eighth transistor has output terminals coupled to the fourth node and the second power supply terminal;

the ninth transistor has output terminals coupled to the fourth node and the first power supply terminal;

the tenth transistor has output terminals coupled to the fourth transistor and the fourth node;

the eleventh transistor has a control terminal coupled to the second node and has output terminals coupled to the first node and the second power supply terminal; and the twelfth transistor has a control terminal coupled to the first node and has output terminals coupled to the second node and the second power supply terminal.

18. The differential signal generator of claim 17, wherein the first, second, third, fourth, sixth, seventh, ninth and tenth transistors are N-channel transistors, and the fifth, eighth, eleventh and twelfth transistors are P-channel transistors.

19. The differential signal generator of claim 17, wherein the first power supply terminal is at ground, and the second power supply terminal is at a positive voltage.

20. The differential signal generator of claim 14, wherein:

a true/complement intermediate signal pair includes first and second signals at the first and second nodes, respectively;

a true/complement output signal pair includes third and fourth signals at the third and fourth nodes respectively;

the first and second signals cross each other at other than a predetermined cross-point in response to logical transitions of a single-ended input signal applied to the input terminal; and the third and fourth signals cross each other at the predetermined cross-point in response to logical transitions of the input signal.

21. The differential signal generator of claim 20, wherein the first and second signals cross each other substantially below the predetermined cross-point in response to the input signal transitioning from a high value to a low value; and the first and second signals cross each other substantially below the predetermined cross-point in response to the input signal transitioning from the low value to the high value.

22. The differential signal generator of claim 21, wherein:

the first transistor couples an output terminal of the seventh transistor to ground thereby decreasing the beta ratio of the first inverter in response to the input signal having the high value;

the first transistor decouples the output terminal of the seventh transistor from ground thereby increasing the beta ratio of the first inverter in response to the input signal having the low value;

the fourth transistor couples an output terminal of the tenth transistor to ground thereby decreasing the beta ratio of the second inverter in response to the input signal having the low value; and the fourth transistor decouples the output terminal of the tenth transistor from ground thereby increasing the beta ratio of the second inverter in response to the input signal having the high value.

23. The differential signal generator of claim 22, wherein the predetermined cross-point is about 50%.

24. A method of generating a true/complement output signal pair in response to a single-ended input signal, comprising:

generating a true/complement intermediate signal pair in response to the input signal, wherein the intermediate signal pair cross each other at other than a predetermined cross-point in response to logical transitions of the input signal;

generating the output signal pair in response to the intermediate signal pair, wherein the output signal pair cross each other at the predetermined cross-point in response to logical transitions of the intermediate signal pair; and dynamically changing the beta ratios of first and second inverters between the intermediate and output signal pairs in response to the input signal;

wherein the beta ratio of the first inverter decreases to a decreased value and the beta ratio of the second inverter increases to an increased value in response to the input signal having a high value; and wherein the beta ratio of the first inverter increases to the increased value and the beta ratio of the second inverter decreases to the decreased value in response to the input signal having a low value.

25. The method of claim 24, wherein:

the intermediate signal pair cross each other substantially below the predetermined cross-point in response to the input signal transitioning from a high value to a low value; and the intermediate signal pair cross each other substantially below the predetermined cross-point in response to the input signal transitioning from the low value to the high value.

26. The method of claim 24, including:

coupling a first transistor in the first inverter to ground and decoupling a second transistor in the second inverter from ground, thereby decreasing the beta ratio of the first inverter and increasing the beta ratio of the second inverter in response to the input signal having a high value; and decoupling the first transistor in the first inverter from ground and coupling the second transistor in the second inverter to ground, thereby increasing the beta ratio of the first inverter and decreasing the beta ratio of the second inverter in response to the input signal having a low value.

27. The method of claim 26, wherein:

the first inverter consists of a P-channel transistor and two N-channel transistors, and one of the N-channel transistors in the first inverter is the first transistor; and the second inverter consists of a P-channel transistor and two N-channel transistors, and one of the N-channel transistors in the second inverter is the second transistor.

28. The method of claim 24, wherein:

the intermediate signal pair and the output signal pair are level shifted with respect to the input signal; and the predetermined cross-point is about 50%.

29. A method of generating a true/complement output signal pair in response to a single-ended input signal, comprising:

applying the input signal to an input stage that generates a true/complement intermediate signal pair in response to the input signal, wherein the intermediate signal pair cross each other substantially below a predetermined cross-point in response to logical transitions of the input signal; and applying the intermediate signal pair to first and second inverters that generate the output signal pair in response to the intermediate signal pair, wherein the first and second inverters have dynamic beta ratios that change in response to the input signal, and the output signal pair cross each other at the predetermined cross-point in response to logical transitions of the intermediate signal pair;

wherein the beta ratio of the first inverter decreases to a decreased value and the beta ratio of the second inverter increases to an increased value in response to the input signal having a high value; and wherein the beta ratio of the first inverter increases to the increased value and the beta ratio of the second inverter decreases to the decreased value in response to the input signal having a low value.

30. The method of claim 29 wherein:

the first inverter includes a P-channel transistor and two N-channel transistors, and one of the N-channel transistors in the first inverter is coupled to ground in response to the input signal having the high value and decoupled from ground in response to the input signal having the low value, thereby dynamically changing the beta ratio of the first inverter; and the second inverter includes a P-channel transistor and two N-channel transistors, and one of the N-channel transistors in the second inverter is coupled to ground in response to the input signal having the low value and decoupled from ground in response to the input signal having the high value, thereby dynamically changing the beta ratio of the second inverter.

31. The method of claim 30, wherein the intermediate signal pair and the output signal pair are level shifted with respect to the input signal.

32. The method of claim 30, wherein the predetermined cross-point is about 50%.

* * * * *